United States Patent [19]

Ibuchi et al.

[11] Patent Number: 5,160,960
[45] Date of Patent: Nov. 3, 1992

[54] METHOD OF TRANSPORTING A PHOTOSENSITIVE SHEET

[75] Inventors: Yoshiaki Ibuchi, Nara; Akira Tamagaki, Soraku, both of Japan

[73] Assignee: Sharp Kabushiki Kaisha, Osaka, Japan

[21] Appl. No.: 699,888

[22] Filed: May 14, 1991

[30] Foreign Application Priority Data

May 15, 1990 [JP] Japan .................... 2-124587

[51] Int. Cl.⁵ .................. G03B 27/52; G03B 27/32
[52] U.S. Cl. ............................ 355/27; 355/77
[58] Field of Search .............. 355/27, 28, 100, 106, 355/72, 75; 242/71.1, 71.2, 71.6

[56] References Cited

U.S. PATENT DOCUMENTS

| | | | |
|---|---|---|---|
| 4,777,513 | 10/1988 | Nelson | 355/27 |
| 4,935,769 | 6/1990 | Ogura | 355/27 |
| 4,965,622 | 10/1990 | Ibuchi | 355/27 |
| 4,994,851 | 2/1991 | Iwai | 355/72 X |
| 5,005,043 | 4/1991 | Kobayashi et al. | 355/27 |
| 5,016,041 | 5/1991 | Sonobe | 355/27 |

*Primary Examiner*—Russell E. Adams
*Assistant Examiner*—D. Rutledge
*Attorney, Agent, or Firm*—David G. Conlin; Donald R. Castle

[57] ABSTRACT

In a method of transporting a photosensitive sheet for image forming operation, the photosensitive sheet is transported forward through an exposure section where a latent image is formed thereon, and then through a pressure-developing section where the photosensitive sheet is pressed against an image receiving sheet to develop the latent image and form a visible image on the image receiving sheet. In this pressure-developing process, the length of the photosensitive sheet which is drawn out from the sheet-feeding rod is measured. Then, the photosensitive sheet is further transported forward until the image receiving sheet is separated therefrom. Thereafter, the photosensitive sheet is transported backward by the length measured in the pressure-developing process. Since the photosensitive sheet is transported backward by the measured length after the image forming operation, the unused portion of the photosensitive sheet remaining between the exposure section and the pressure-developing section can be accurately transported backward to be used for the next image forming operation.

6 Claims, 7 Drawing Sheets

METHOD OF TRANSPORTING A PHOTOSENSITIVE SHEET

BACKGROUND OF THE INVENTION

1. Field of the Invention

The present invention relates to a method of transporting a photosensitive sheet in an image forming apparatus, and more particularly relates to a method of successively transporting a photosensitive sheet from a roll of the sheet wound up around a sheet-feeding rod, and then through image forming process units such as an exposure section and a pressure-developing section, and thereafter onto a take up rod.

2. Description of the Prior Art

FIG. 5 diagrammatically shows the main part of a typical image forming apparatus which utilizes a photosensitive sheet 51 and an image receiving sheet 55. One side of the photosensitive sheet 51 is coated with pressure-rupturable microcapsules containing a light sensitive hardener and a chromogenic material. Because of the light sensitive hardener, the microcapsules harden when exposed to light. One side of the image receiving sheet is coated with a developing material which reacts with the chromogenic material to give rise to color in the chromogenic material. The photosensitive sheet 51 is previously rolled up around a sheet-feeding rod 52. The roll of the photosensitive sheet 51 is disposed within a cartridge 53. The cartridge 53 protects the photosensitive sheet 51 from undesirable light or pressure. The free end of the photosensitive sheet 51 is drawn out of the cartridge 53, and transported through image forming process units such as an exposure section P1, a pressure-developing section P2, and the like, and then wound up around a take up rod 54. In this state, image forming operation starts, as will be described below.

First, an exposure process is performed as follows: A predetermined length of the photosensitive sheet 51 is drawn out from the sheet-feeding rod 52 to be transported through the exposure section P1, where it is exposed to light reflected from an original to be copied. The light selectively illuminates the photosensitive sheet 51 so that some of the microcapsules thereon receive light to harden and the other microcapsules do not receive light and are left unchanged, thereby forming a latent image corresponding to the original on the photosensitive sheet 51. The front end of the thus produced latent image is located in a position on the photosensitive sheet 51 which was located at the exposure section P1 before the exposure process.

After the exposure process, the portion of the photosensitive sheet 51 having the latent image thereon is conveyed toward the pressure-developing section P2. When the front end of the latent image reaches the pressure-developing section P2, the image receiving sheet 55 is also fed thereinto, thereby starting a pressure-developing process. In the pressure-developing process, the photosensitive sheet 51 and the image receiving sheet 55 are pressed against each other while they are passing through the pressure-developing section P2. As a result, the microcapsules which have not hardened rupture, allowing the chromogenic material therein to flow out onto the image receiving sheet 55. The chromogenic material then reacts with the developing material on the image receiving sheet 55 to impart color thereto, resulting in a visible image on the image receiving sheet 55. This pressure-developing process is completed when the rear ends of both the latent image and the image receiving sheet 55 pass through the pressure-developing section P2. After the pressure-developing process, the photosensitive sheet 51 is further transported through the pressure-developing section P2 toward the take up rod 54 until the image receiving sheet 55 with the visible image formed thereon is separated from the photosensitive sheet 51 at a separating roller 56.

At the end of the image forming operation described above, the rear end of the latent image on the photosensitive sheet 51 is located ahead of the pressure-developing section P2, while a certain length of the photosensitive sheet 51 which has not been used for image formation remains between the exposure section P1 and the pressure-developing section P2. If the next exposure process begins immediately after the above image forming operation, the front end of the next latent image to be formed will be in a position on the photosensitive sheet 51 which is now located at the exposure section P1. Thus, the above-mentioned portion of the photosensitive sheet 51 located between the exposure section P1 and the pressure-developing section P2 will remain unused and wasted.

A method of transporting a photosensitive sheet has been proposed in which the above-mentioned unused portion of the photosensitive sheet is transported backward to be used for the formation of the next latent image. In this conventional method, however, the actual length of the unused portion of the photosensitive sheet which has been transported in the preceding image forming operation is not measured. The photosensitive sheet is just transported backward for a predetermined period of time after each image forming operation. Thus, it is difficult to accurately transport the photosensitive sheet backward by the actual length of the unused portion.

The inaccuracy in the backward transportation of the photosensitive sheet causes the following problems. If the photosensitive sheet is transported backward by a length shorter than that of the unused portion of the sheet, part of the unused portion remains between the exposure section and the pressure-developing section and is accordingly wasted. If the photosensitive sheet is transported backward by a length longer than that of the unused portion of the sheet, the portion of the sheet which has passed through the pressure-developing section is also transported backward to be used for the next image formation. As described above, this portion of the photosensitive sheet has been transported through the pressure-developing section to allow the image receiving sheet to be separated from the photosensitive sheet at the separating roller. Since this portion may have been scratched while passing through the pressure-developing section, the latent image to be formed on this portion in the next image forming operation will have poor quality.

SUMMARY OF THE INVENTION

The method of transporting a photosensitive sheet of this invention, which overcomes the above-discussed and numerous other disadvantages and deficiencies of the prior art, is a method of transporting a photosensitive sheet in an image forming apparatus, wherein the photosensitive sheet is first drawn out from a sheet-feeding rod and transported forward through an exposure section where it is subjected to an exposure process to have a latent image formed thereon, and then the portion of the photosensitive sheet having the latent image thereon is transported forward into a pressure-developing section where at the same time an image receiving sheet is also supplied to be pressed against the photosensitive sheet so that the latent image is developed and transferred onto the image receiving sheet through a pressure-developing process, and thereafter the photosensitive sheet is further transported forward to allow the image receiving sheet to be separated therefrom; said method comprises the steps of measuring the length of the photosensitive sheet which is drawn out from the sheet-feeding rod in the pressure-developing process, and transporting backward the photosensitive sheet by said measured length toward the sheet-feeding rod after the image receiving sheet is separated from the photosensitive sheet.

In preferred embodiments, the step of measuring the length of the photosensitive sheet is performed by using the number of rotations of the sheet feeding rod in the pressure-developing process, the length of the photosensitive sheet drawn out from the sheet feeding rod being determined on the basis of the number of rotations of the sheet feeding rod.

In preferred embodiments, the number of rotations of the sheet feeding rod is determined by a rotation detecting means for detecting the rotations of the sheet feeding rod and by a counting means for counting the detected results of the rotation detecting means to obtain a counted value which represents the number of rotations of the sheet feeding rod, the counted value corresponding to the length of the photo-sensitive sheet drawn out from the sheet feeding rod in the pressure-developing process.

In preferred embodiments, the step of transporting backward the photosensitive sheet toward the sheet feeding rod is performed by transporting the photosensitive sheet backward by the length corresponding to said counted value of the counting means.

In preferred embodiments, the forward transportation of the photosensitive sheet through the exposure section is performed by the movement of a transporting means away from its home position, and the forward transportation of the photosensitive sheet through the pressure-developing section is first performed by the backward movement of the transporting means toward its home position and then performed by drawing out the photosensitive sheet from the sheet-feeding rod, said step of measuring the length of the photosensitive sheet drawn out from the sheet-feeding rod being allowed to start at the time when the transporting means reaches its home position and to stop at the end of the pressure-developing process.

In preferred embodiments, the step of measuring the length of the photosensitive sheet drawn out from the sheet-feeding rod is performed by counting marks on the photosensitive sheet in the pressure-developing process.

Thus, the invention described herein makes possible the objective of providing a method of transporting a photosensitive sheet, in which the unused portion of the photosensitive sheet located between the exposure section and the pressure-developing section is transported backward with high accuracy after the image forming operation to be used for the next image forming operation, so that no portion of the photosensitive sheet which may have been scratched at the pressure-developing section is used for the next image forming operation, and that the waste of the photosensitive sheet can be eliminated, thereby reducing the operational cost.

According to a preferred embodiment, the length of the photosensitive sheet which has been drawn out from the sheet-feeding rod during a pressure-developing process is measured. After the pressure-developing process, the photosensitive sheet is further transported toward the take up rod until the image receiving sheet is separated from the photosensitive sheet. Thereafter, the photosensitive sheet is transported back toward the sheet-feeding rod by the length measured during the pressure-developing process.

In this preferred embodiment, since the photosensitive sheet is transported backward by the measured length, the length of the photosensitive sheet to be transported backward can be just the same as that of the photosensitive sheet which has been drawn out from the sheet-feeding rod in the pressure-developing process. Therefore, the unused portion of the photosensitive sheet located between the exposure section and the pressure-developing section can be accurately transported backward to be used for the next image forming operation. This prevents the photosensitive sheet from being excessively transported backward, so that the portion of the photosensitive sheet which may have been scratched at the pressure-developing section is not used for the next image formation. Furthermore, since the entire unused portion of the photosensitive sheet located between the exposure section and the pressure-developing section can be transported backward for the next image formation, the waste of the photosensitive sheet can be eliminated, thereby reducing the operational cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 3:
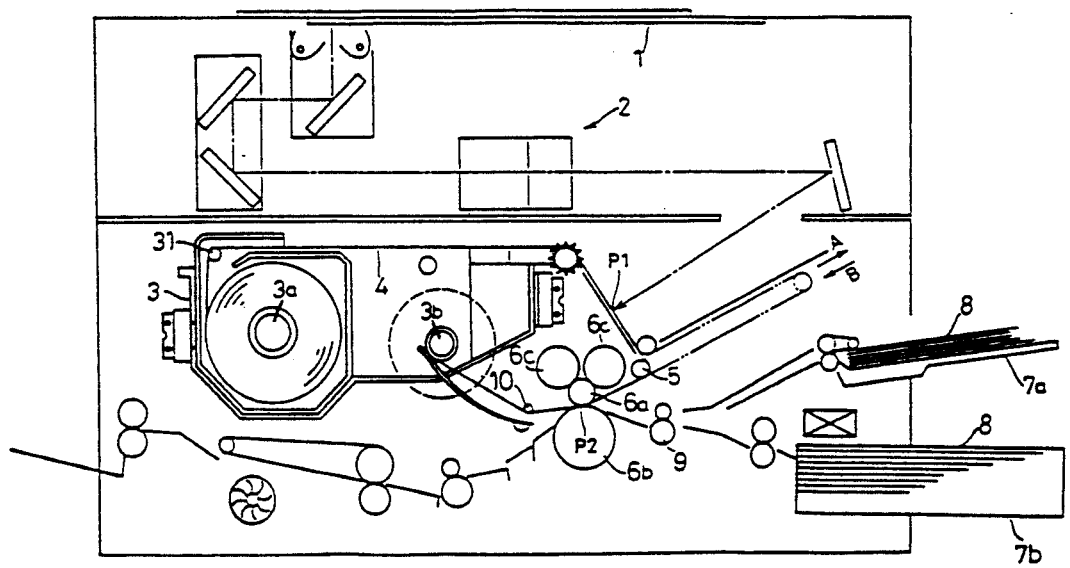
FIG. 3 is a sectional side elevation of an image forming apparatus including a system embodying a method of transporting a photosensitive sheet according to the invention.

A method of transporting a photosensitive sheet according to the present invention is used in an image forming apparatus such as shown in FIG. 3.

The apparatus of FIG. 3 comprises a cartridge 3 detachably mounted in the body thereof. The cartridge 3 includes a sheet-feeding rod 3a and a take up rod 3b. A photosensitive sheet 4 is previously rolled up around the sheet-feeding rod 3a. The free end of the photosensitive sheet 4 is drawn out of the cartridge 3, conveyed along a guide roller 31, through an exposure section P1, and along a buffer roller 5, and then transported through a pressure-developing section P2 and along a separating roller 10, and finally onto the take up rod 3b to be wound around it, as shown in FIG. 3. In this state, image forming operation starts, which will be described later.

The sheet-feeding rod 3a and the take up rod 3b are connected to a main motor M1 via a clutch CL3 and a clutch CL4, respectively (See FIG. 4), so that they can rotate in such directions as to transport the photosensitive sheet 4 forward (from the sheet-feeding rod 3a toward the take up rod 3b) and backward (from the take up rod 3b toward the sheet-feeding rod 3a). The sheet-feeding rod 3a and the take up rod 3b can be locked to stop rotation and unlocked to start rotation by means of the clutches CL3 and CL4, respectively.

On the top surface of the body of the image forming apparatus is provided a document plate 1 on which an original to be copied is placed. An optical system 2 including light sources, mirrors, a lens, etc., is located below the document plate 1. By means of the optical system 2, the image of the original placed on the document plate 1 is scanned, and then the light reflected from the original is directed to the exposure section P1.

The pressure-developing section P2 includes pressure rollers 6a and 6b which are provided with a pressure mechanism including springs, cams, etc., (not shown), so that they can be pressed against each other. A pair of backup rollers 6c disposed adjacent to the pressure rollers 6a and 6b ensures that the pressure to be applied by the pressure rollers 6a and 6b is uniform along the direction of their rotation axes. The pressure rollers 6a and 6b are connected to the main motor M1 via a clutch CL2 so that they can rotate when required.

The buffer roller 5 disposed between the exposure section P1 and the pressure-developing section P2 is connected to the main motor M1 via a clutch C1 to move in the direction of arrow A to its buffer position BP and also in the direction of arrow B to its home position HP when required (See FIGS. 2A to 2E).

One side of the body of the image forming apparatus is provided with paper cassettes 7a and 7b which contain image receiving sheets 8 of two different sizes, respectively. When starting the image forming operation, the operator selects a desired sheet size by means of an operation panel (not shown) attached to the upper surface of the body of the apparatus, so that an image receiving sheet 8 is fed out of the corresponding paper cassette 7a or 7b. The image receiving sheet 8 is then fed to a pair of timing rollers 9. The timing rollers 9 rotate at a prescribed timing to feed the image receiving sheet 8 into the pressure-developing section P2.

The photosensitive sheet 4 is a sheet made of resin, one side of which is coated with pressure-rupturable microcapsules containing a light sensitive hardener, a chromogenic material, and the like. Because of the light sensitive hardener, the microcapsules harden when exposed to light. One side of each image receiving sheet 8 is coated with a developing material which reacts with the chromogenic material to give rise to color in the chromogenic material. Accordingly, when the photosensitive sheet 4 and the image receiving sheet 8 is pressed against each other, as will be described later, the microcapsules on the photosensitive sheet 4 rupture, allowing the chromogenic material to flow out onto the image receiving sheet, so that the developing material on the image receiving sheet 8 reacts with the chromogenic material to impart color to the image receiving sheet 8.

The photosensitive sheet which can be used in the embodiment is not restricted to the above-mentioned one. For example, instead of the chromogenic material, dyes can be contained in the microcapsules. Alternatively, a photosensitive sheet may be coated with microcapsules including a chromogenic material and further coated with a developing material. In these cases, the image receiving sheet need not be coated with any developing material.

Figure 4:
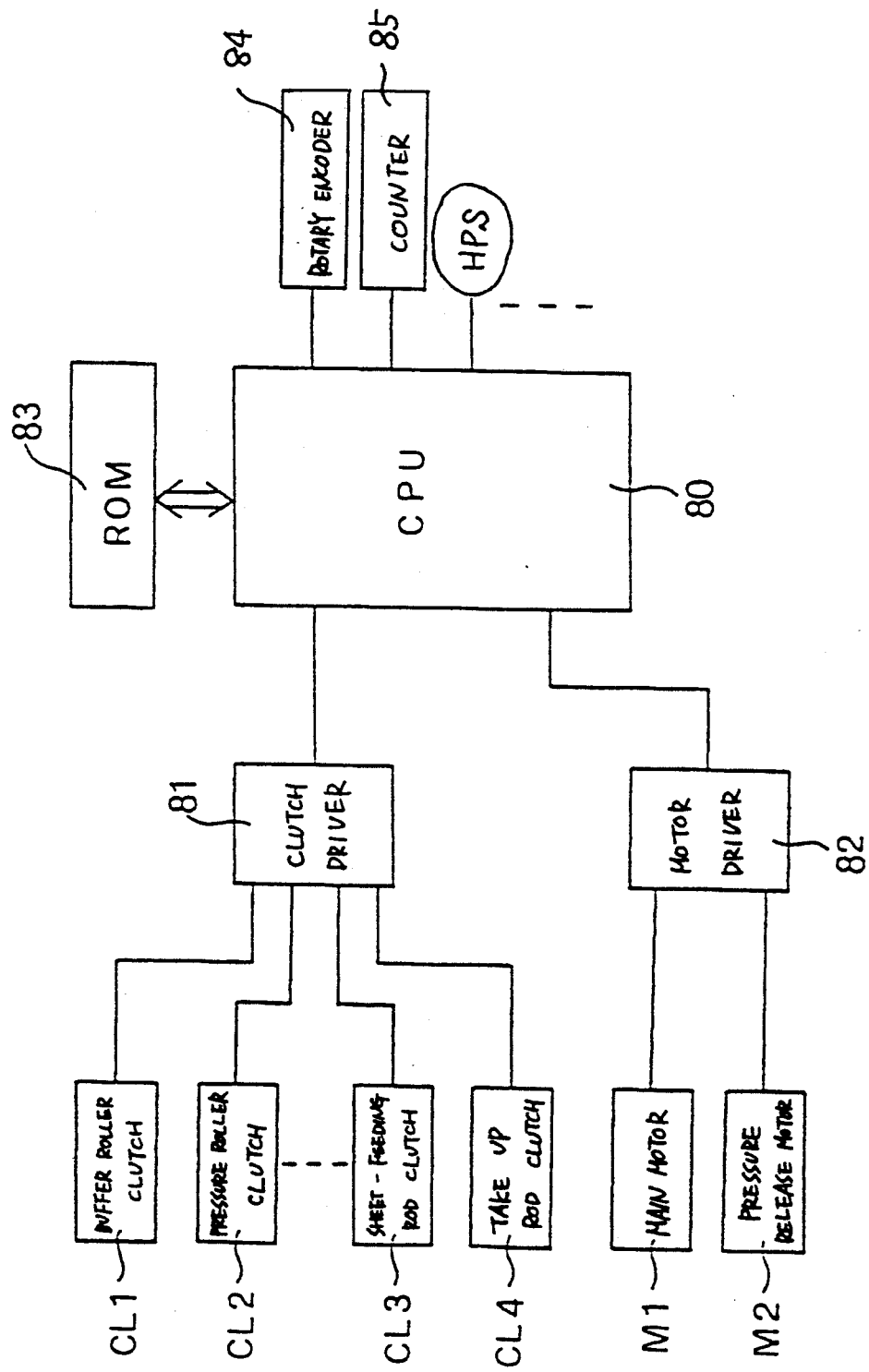
FIG. 4 is a block diagram of the control system of the apparatus of FIG. 3.
Figure 5:
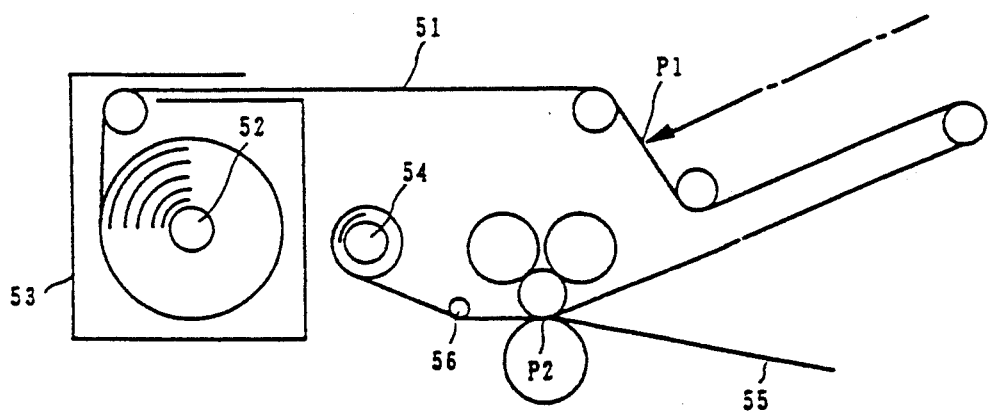
FIG. 5 is a schematic diagram showing the main part of a typical image forming apparatus utilizing a photosensitive sheet.

FIG. 4 shows the control system in the apparatus of FIG. 3. The control system includes a central processing unit (CPU) 80 which operates in accordance with a program stored in a read only memory (ROM) 83 so as to control the transportation of the photosensitive sheet 4. The buffer roller 5 is driven by the main motor M1 with the clutch CL1 engaged. The clutch CL1 is engaged or disengaged by a clutch driver 81 under the control of the CPU 80. Similarly, the main motor M1 is turned on or off by a motor driver 82 under the control of the CPU 80. The pressure rollers 6a and 6b are rotated by driving the main motor M1 with the clutch CL2 engaged, also under the control of the CPU 80. The CPU 80 also instructs the motor driver 82 to drive a pressure release motor M2 to release the pressure applied by the pressure rollers 6a and 6b. The CPU 80 also controls the engagement or disengagement of the clutches CL3 and CL4 via the clutch driver 81, so as to control the rotation of the sheet-feeding rod 3a and the take up rod 3b. As described above, the sheet-feeding rod 3a is connected to the main motor M1 via the clutch CL3, so that it can rotate with the clutch CL3 engaged and can be locked to stop rotation with the clutch CL3 disengaged. In the same manner, the take up rod 3b can rotate with the clutch CL4 engaged and can be locked to stop rotation with the clutch CL4 disengaged.

The CPU 80 controls the above-described operation of the rollers according to signals sent from sensors. For example, a home position sensor HPS is provided near the home position HP of the buffer roller 5 to detect the presence of the buffer roller 5. According to signals sent from the home position sensor HPS, the CPU 80 controls the movement of the buffer roller 5.

In this embodiment, the length of the photosensitive sheet 4 drawn out from the sheet-feeding rod 3a is measured under the control of the CPU 80. The sheet-feeding rod 3a is provided with a rotary encoder 84 which detects the rotation thereof. The rotary encoder 84 outputs pulses in accordance with the number of rotations of the sheet-feeding rod 3a. A counter 85 then counts the pulses output from the rotary encoder 84, and sends the counted value to the CPU 80. Since the number of rotations of the sheet-feeding rod 3a determines the length of the photosensitive sheet which has been drawn out therefrom, the CPU 80 calculates the length of the drawn-out portion of the photosensitive sheet 4, based on the counted value output from the counter 85.

Figure 1:
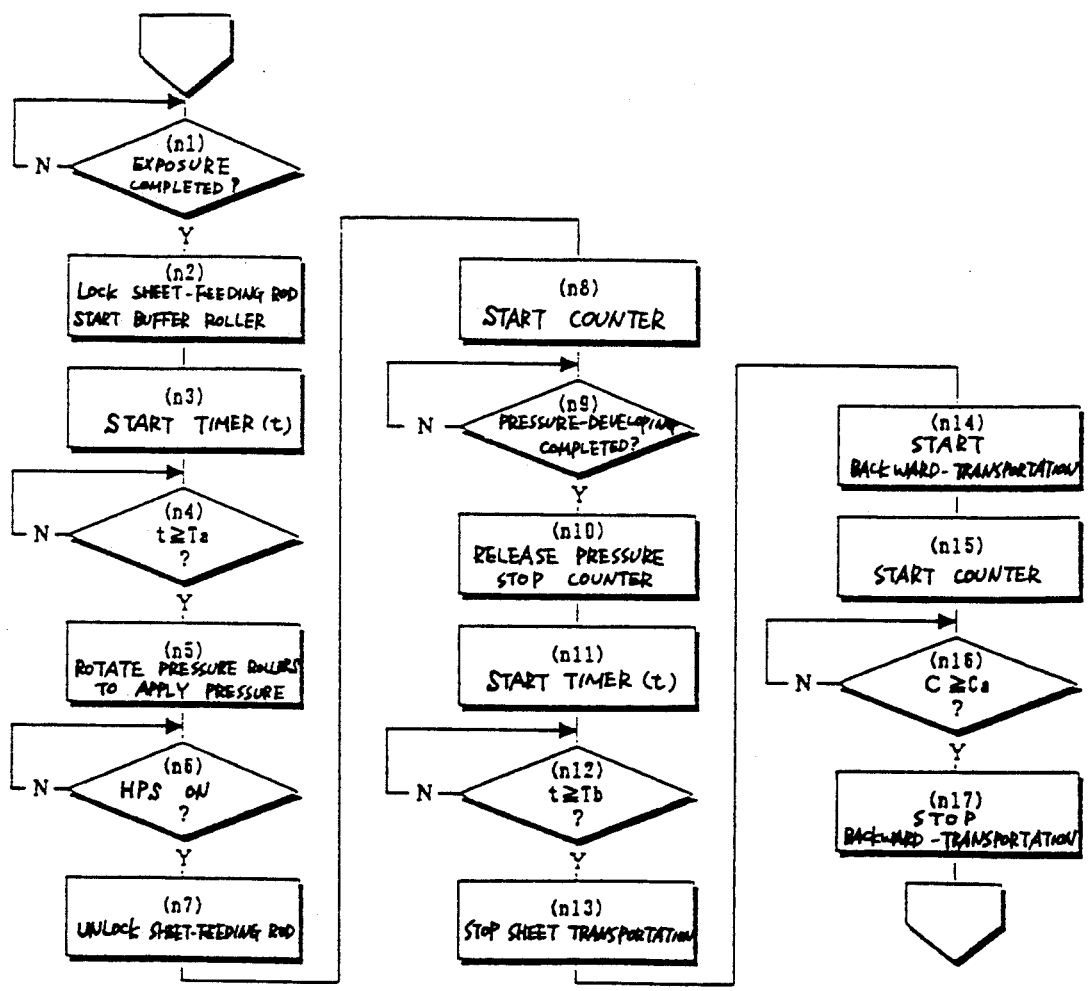
FIG. 1 is a flowchart illustrating the procedure for transporting a photosensitive sheet according to a method of the invention.

FIG. 1 is a flowchart illustrating the procedure for transporting a photosensitive sheet according to the present invention. The sheet transportation is, as described above, controlled by the CPU 80. Image forming operation in the apparatus of FIG. 3 using the method of the present invention will now be described with reference t the flowchart of FIG. 1 and the diagrams of FIGS. 2A to 2E.

Figure 2A:
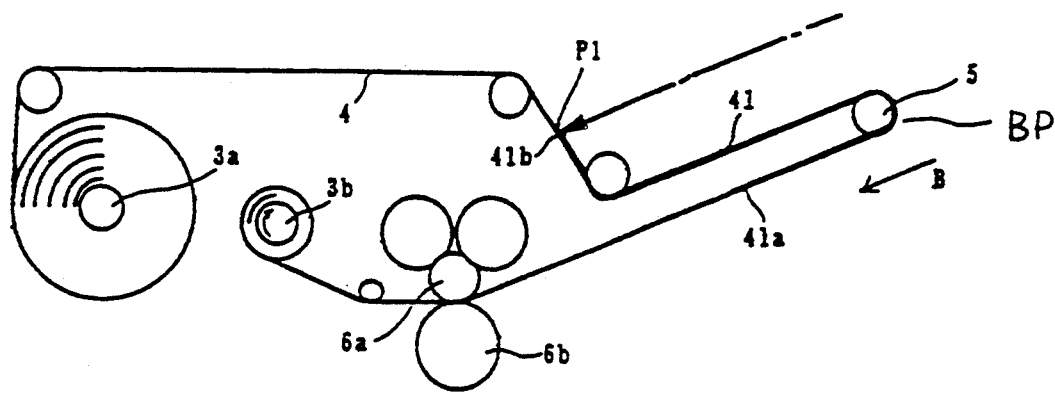
FIGS. 2A to 2E are schematic diagrams illustrating the transportation of a photosensitive sheet according to a method of the invention.

First, an exposure process is performed as follows. The buffer roller 5 moves in the direction of arrow A, with the sheet-feeding rod 3a unlocked and the take up rod 3b locked. This allows a certain length of the photosensitive sheet 4 to be drawn out from the sheet-feeding rod 3a. While the photosensitive sheet 4 is being drawn out and passing through the exposure section P1, the light reflected from an original to be copied is directed by the optical system 2 onto the exposure section P1, thereby exposing the photosensitive sheet 4 passing therethrough. The reflected light selectively illuminates the photosensitive sheet 4 so that some of the microcapsules thereon receive the light to harden, and the other microcapsules do not receive the light and are left unchanged, resulting in a latent image corresponding to the original. This is the end of the exposure process (step n1). FIG. 2A diagrammatically illustrates the main part of the image forming apparatus in which the above-described exposure process has just been finished. The latent image formed on the photosensitive sheet 4 is indicated by the thick solid line 41. The front end of the latent image is denoted by the reference numeral 41a, and the rear end thereof by 41b. As shown in FIG. 2A, at the end of the exposure process, the latent image 41 is mainly located in a buffer area positioned between the home position HP and the buffer position BP of the buffer roller 5, with its rear end 41b located at the exposure section P1.

After the exposure process is completed, the sheet-feeding rod 3a is locked, and at the same time the buffer roller 5 starts to move in the direction of arrow B, thereby transporting the photosensitive sheet 4 toward the pressure-developing section P2 (step n2). By the movement of the buffer roller 5 in the direction of arrow B, the latent image 41 is conveyed toward the pressure-developing section P2. At this time, the pressure rollers 6a and 6b do not apply pressure to the photosensitive sheet 4, allowing the photosensitive sheet 4 to pass therebetween and to be wound up around the take up rod 3b. When the buffer roller 5 starts to move in the direction of arrow B, a timer t starts (step n3) to count a predetermined period of time Ta which is the time required for the front end 41a of the latent image 41 to reach the pressure-developing section P2.

Figure 2B:
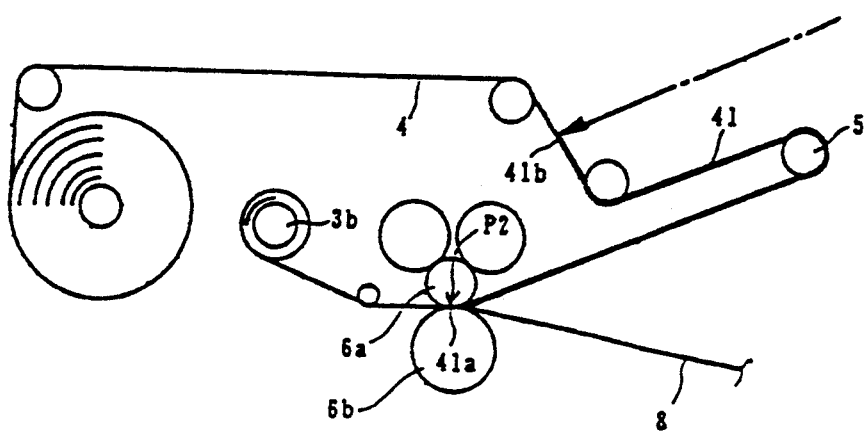

When the timer t counts up the time Ta (step n4), the front end 41a of the latent image 41 reaches the pressure-developing section P2, where at the same time one of the image receiving sheets 8 is supplied and brought together with the photosensitive sheet 4, as shown in FIG. 2B. At this time, the pressure rollers 6a and 6b start to rotate while pressing the photosensitive sheet 4 against the image receiving sheet 8 (step n5), thereby starting a pressure developing process.

Figure 2C:
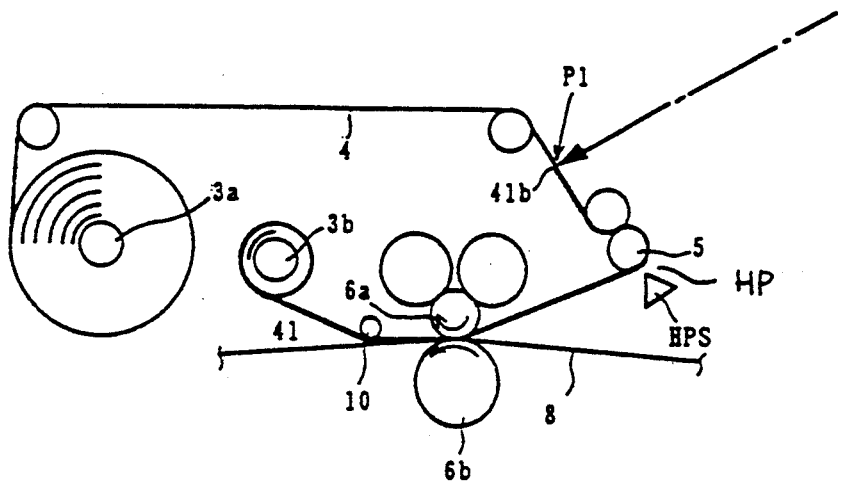

At the beginning of the pressure-developing process, the sheet-feeding rod 3a remains locked, so that the photosensitive sheet 4 is not drawn out therefrom. The latent image 41 on the photosensitive sheet 4 is transported through the pressure-developing section P2 just by the movement of the buffer roller 5 i the direction of arrow B. When the buffer roller 5 reaches the home position HP as shown in FIG. 2C, the home position sensor HPS located near the home position HP detects the presence of the buffer roller 5, and is accordingly turned on (step n6). When the home position sensor HPS is turned on, the sheet-feeding rod 3a is unlocked, thereby allowing the photosensitive sheet 4 to be drawn out therefrom by the rotation of the pressure rollers 6a and 6b (step n7). Accordingly, the photosensitive sheet 4 and the image receiving sheet 8 continue passing through the pressure-developing section P2 while being pressed against each other. In order to determine the length of the photosensitive sheet 4 which is drawn out from the sheet-feeding rod 3a in the pressure-developing process, the counter 85 starts to count the pulses sent from the rotary encoder 84 (step n8).

As described above, while the latent image 41 and the image receiving sheet 8 are passing through the pressure-developing section P2, they are pressed against each other. This allows the latent image 41 to be developed and transferred onto the image receiving sheet 8 as follows: Because of the pressure applied by the pressure rollers 6a and 6b, the microcapsules on the latent image 41 which did not harden in the above-described exposure process rupture, allowing the chromogenic material therein to flow out onto the image receiving sheet 8 coated with the developing material. The developing material then reacts with the chromogenic material to impart color to the image receiving sheet 8, so that a visible image corresponding to the latent image 41 is formed on the image receiving sheet 8.

Figure 2D:
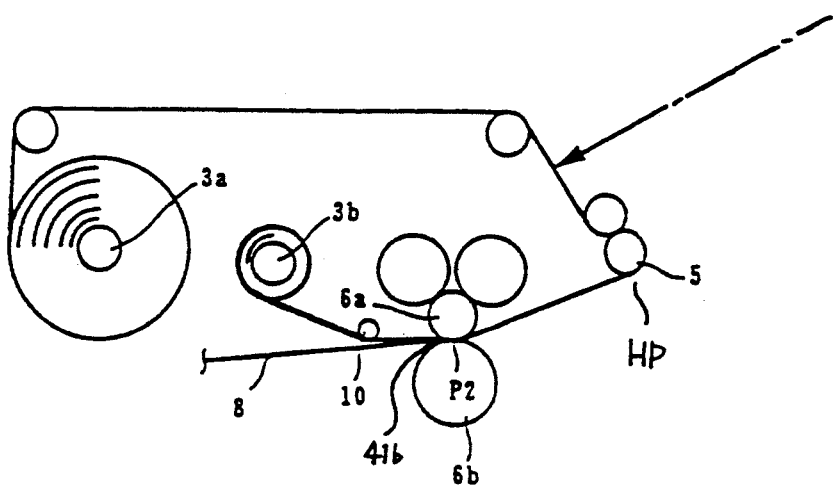

When the pressure-developing process is completed, the pressure applied by the pressure rollers 6a and 6b is released and the counter 85 stops counting the pulses output from the rotary encoder 84 (steps n9 and n10). As a result, the counter 85 obtains a counted value Ca representing the number of rotations of the sheet-feeding rod 3a. The counted value Ca corresponds to the length of the photosensitive sheet 4 which has been drawn out from the sheet-feeding rod 3a in the pressure-developing process. At this time, the rear end 41b of the latent image 41 is positioned at the pressure-developing section P2 as shown in FIG. 2D. Then, the timer t starts to count a predetermined period of time Tb which is the time required for the rear end 41b of the latent image 41 and the rear end of the image receiving sheet 8 to reach the separating roller 10 (step n11). Since the direction of the transportation of the photosensitive sheet 4 is turned slightly upward at the separating roller 10, the image receiving sheet 8 is readily separated from the photosensitive sheet 4 at the separating roller 10. When the timer t counts up the time Tb (step n12), the rear end of the image receiving sheet 8 reaches the separating roller 10 to be separated from the photosensitive sheet 4. Then, the transportation of the photosensitive sheet 4 stops (step n13), thereby completing the image forming operation.

At the end of the image forming operation, a portion of the photosensitive sheet 4 which has not been used for image formation remains between the exposure section P1 and the pressure-developing section P2. The portion of the photosensitive sheet 4 located between the pressure-developing section P2 and the separating roller 10 also remains unused but may have been scratched by the pressure rollers 6a and 6b while passing therebetween. Therefore, according to the present invention, after the image forming operation is completed, only the unused portion of the photosensitive sheet 4 located between the exposure section P1 and the pressure-developing section P2 is transported backward to be used for the next image forming operation, as will be described below.

Figure 2E:
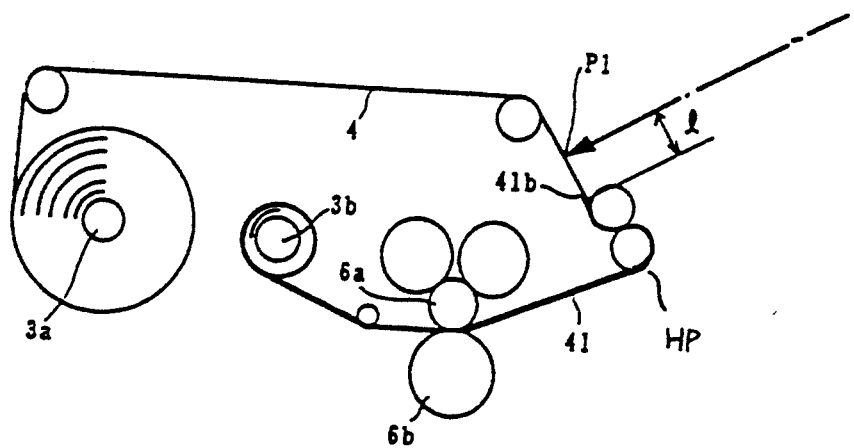

First, the sheet-feeding rod 3a rotates in the reverse direction so as to transport backward the photosensitive sheet 4 toward the sheet-feeding rod 3a, and at the same time the counter 85 starts to count the counted value Ca (steps n14 and n15). When the counter 85 counts up the counted value Ca (step n16), the backward transportation stops (step n17). Since the counted value Ca corresponds to the actual length of the photosensitive sheet 4 drawn out from the sheet-feeding rod 3a in the pressure-developing process as described above, the photosensitive sheet 4 can be accurately transported backward by this actual length. At the end of the backward transportation, as shown in FIG. 2E, a length l of the photosensitive sheet 4 which is located just behind the latent image 41 remains ahead of the exposure section P1 so that this portion of the photosensitive sheet 4 (hereinafter referred to as the "portion L") will not be used for the next exposure process. The length l of the portion L is substantially the same as the distance between the pressure-developing section P2 and the separating roller 10. This means that the portion L of the photosensitive sheet 4 was transported through the pressure-developing section P2 toward the separating roller 10 after the pressure-developing process, and accordingly it may have been scratched by the pressure rollers 6a and 6b. In this embodiment, the backward transportation stops when the rear end of the portion L reaches the position just ahead of the exposure section P1. Therefore, no portion of the photosensitive sheet 4 which may have been damaged is used for the next image forming operation.

In the above-described embodiment, the rotary encoder 84 is mounted on the sheet-feeding rod 3a to measure the length of the photosensitive sheet 4 drawn out from the sheet-feeding rod 3a during the pressure-developing process, but the rotary encoder 84 can be mounted on other rollers, for example, on the guide roller 31. Alternatively, marks may be put on the photosensitive sheet 4 so that the length of the sheet drawn out from the sheet-feeding rod 3a is measured by counting the marks.

As described above, according to the present invention, the length of a photosensitive sheet which is drawn out from the sheet-feeding rod is measured in a pressure-developing process, and the measured length of the photosensitive sheet is transported backward after each image forming operation. Thus, the unused portion of the photosensitive sheet remaining between the exposure section and the pressure-developing section can be accurately transported backward for the succeeding image forming operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of transporting a photosensitive sheet in an image forming apparatus, wherein the photosensitive sheet is first drawn out from a sheet-feeding rod and transported forward through an exposure section where it is subjected to an exposure process to have a latent image formed thereon, and then the portion of the photosensitive sheet having the latent image thereon is transported forward into a pressure-developing section where at the same time an image receiving sheet is also supplied to be pressed against the photosensitive sheet so that the latent image is developed and transferred onto the image receiving sheet through a pressure-developing process, and thereafter the photosensitive sheet is further transported forward to allow the image receiving sheet to be separated therefrom, said method comprising the steps of measuring the length of the photosensitive sheet which is drawn out from the sheet feeding rod in the pressure-developing process, and transporting the photosensitive sheet by said measured length backward toward the sheet-feeding rod after the image receiving sheet is separated from the photosensitive sheet;

wherein the forward transportation of the photosensitive sheet through the exposure section is performed by the movement of a transporting means away from its home position, and the forward transportation of the photosensitive sheet through the pressure developing section is first performed by the backward movement of the transporting means toward its home position and then performed by drawing out the photosensitive sheet from the sheet-feeding rod, said step of measuring the length of the photosensitive sheet drawn out from the sheet feeding rod being allowed to start at the time when the transporting means reaches its home position and to stop at the end of the pressure-developing process.

2. A method according to claim 1, wherein said step of measuring the length of the photosensitive sheet is performed by using the number of rotations of the sheet feeding rod in the pressure-developing process, the length of the photosensitive sheet drawn out from the sheet feeding rod being determined on the basis of the number of rotations of the sheet feeding rod.

3. A method according to claim 2, wherein said number of rotations of the sheet feeding rod is determined by a rotation detecting means for detecting the rotations of the sheet feeding rod and by a counting means for counting the detected results of the rotation detecting means to obtain a counted value which represents the number of rotations of the sheet feeding rod, the counted value corresponding to the length of the photosensitive sheet drawn out from the sheet feeding rod in the pressure-developing process.

4. A method according to claim 3, wherein said step of transporting backward the photosensitive sheet toward the sheet feeding rod is performed by transporting the photosensitive sheet backward by the length corresponding to said counted value of the counting means.

5. A method according to claim 1, wherein said step of measuring the length of the photosensitive sheet drawn out from the sheet-feeding rod is performed by counting marks on the photosensitive sheet in the pressure-developing process.

6. A method of transporting a photosensitive sheet through an image forming apparatus, comprising the steps of:

(a) drawing a photosensitive sheet from a sheet-feeding rod through an exposure section where a portion of the photosensitive sheet is exposed to form a latent image on the photosensitive sheet;

(b) transporting the photosensitive sheet through a pressure developing section with an image receiving sheet a first distance to develop the complete latent image and transfer it to the image receiving sheet;

(c) further transporting the photosensitive sheet through the pressure-developing section a second distance sufficient to separate the image receiving sheet from the photosensitive sheet; and, (d) transporting the photosensitive sheet backward the first distance to position in the exposure section a portion of the photosensitive sheet which was not transported through said pressure-developing section;

wherein the first distance is measured by counting marks on the photosensitive sheet during the pressure-developing process.

* * * * *